United States Patent [19]

Lytle

[11] Patent Number: 5,100,827
[45] Date of Patent: Mar. 31, 1992

[54] BURIED ANTIFUSE

[75] Inventor: Steven A. Lytle, Bethlehem, Pa.

[73] Assignee: AT&T Bell Laboratories, Murray Hill, N.J.

[21] Appl. No.: 661,736

[22] Filed: Feb. 27, 1991

[51] Int. Cl.⁵ .................. H01L 21/70; H01L 27/00
[52] U.S. Cl. .......................... 437/52; 437/43; 437/170; 437/228; 437/922; 148/DIG. 55; 365/96; 365/163
[58] Field of Search .............. 437/170, 922, 43, 228, 437/52; 148/DIG. 55; 365/163, 96

[56] References Cited

U.S. PATENT DOCUMENTS

| | | | |
|---|---|---|---|
| 4,203,123 | 5/1980 | Shanks | 365/163 |
| 4,442,507 | 4/1984 | Rocsner | 365/100 |
| 4,569,120 | 2/1986 | Stacy et al. | 437/52 |
| 4,599,705 | 7/1986 | Holmberg et al. | 365/163 |
| 4,605,872 | 8/1986 | Rung | 337/43 |
| 4,748,490 | 5/1988 | Hollingsworth | 357/51 |
| 4,914,055 | 4/1990 | Gordon et al. | 437/228 |
| 4,916,090 | 4/1990 | Motai et al. | 437/170 |

FOREIGN PATENT DOCUMENTS 1-206631  8/1989  Japan .................. 437/170

OTHER PUBLICATIONS

IEEE, 1986, "Amorphous Silicon Antifuse Technology for Bipolar Proms," by Messrs. Brian Cook and Steve Keller, p. 99.

*Primary Examiner*—Brian E. Hearn
*Assistant Examiner*—Kevin M. Picardat
*Attorney, Agent, or Firm*—Richard D. Laumann

[57] ABSTRACT

An integrated circuit having one or more antifuses which connect electrical components through a dielectric layer. The antifuse is formed before the thick dielectric is deposited and patterned to form windows which expose the antifuse.

5 Claims, 1 Drawing Sheet

BURIED ANTIFUSE

TECHNICAL FIELD

This invention relates to integrated circuits having one or more electrically programmable antifuses.

BACKGROUND OF THE INVENTION

The most sophisticated integrated circuits today have millions of components and require complex fabrication techniques. The techniques, beginning with the design of a complete mask set, generally require an extended time period to complete and are relatively expensive to implement. The expense is justified for integrated circuits that are produced either in high volumes or for high prices, but simplified techniques are desirable for circuits produced cheaply and in low volumes or which must be fabricated relatively quickly. Accordingly, approaches have been developed which do not require the complete customized mask set used with conventional fabrication techniques.

One approach uses a standard mask set for all integrated circuits and then customizes the circuits for particular applications after fabrication has been completed. This approach is commonly used for programmable logic arrays (PLA) and many read only memories (ROM). An essential step in the customization process is the selective opening or closing of an electrical circuit.

Several techniques have been developed to selectively open or close circuits, and the technique for closing an electrical circuit of interest for this application applies a voltage, in excess of a threshold voltage, across a structure and thereby changes the structure from a high resistance OFF state to a low resistance ON state. The structure is termed an antifuse in analogy with the better known fuse which changes from a low resistance ON state to a high resistance OFF state. Many techniques for fabricating antifuses have been developed. For example, a layer of amorphous silicon may be used between two conducting materials. When a voltage in excess of the threshold voltage is applied, the resistance of the amorphous silicon decreases dramatically. See, for example, U.S. Pat. Nos. 4,442,507 and 4,599,705 issued on Apr. 10, 1984 and July 8, 1986, respectively, and Cook, pp. 99–100, 1986 Bipolar Circuits and Technology Meeting for descriptions of representative antifuse techniques.

Within the circuit, the antifuses may perform different functions. For example, the antifuses may contain the stored information in a memory or they may be used to selectively connect different components within the circuit. It will be appreciated that in many applications the antifuse completes an electrical circuit through an interlevel dielectric. The details of the processes used to form an antifuse through an interlevel dielectric differ, but the process will pattern the dielectric to form windows which expose portions of the underlying material and then deposit a material, e.g., amorphous silicon, in the window and another conductive material on the amorphous silicon. A voltage is applied to program the device, i.e., to change its resistance.

This process produces adequate results for many applications, but it has been found that the programming voltage and the leakage current may vary significantly from device to device and that the ON state resistance varies slowly with time. In the process described above, it is difficult to control precisely the thickness of the amorphous silicon at the bottom of the window due to, e.g., poor step coverage. The window typically has an aspect ratio, i.e., ratio of window height to window width greater than 1:1. It is believed that this thickness variation is one of the processing parameters that leads to the undesirable variations in device characteristics mentioned.

SUMMARY OF THE INVENTION

A method of integrated circuit fabrication is described which includes forming an antifuse by the steps of forming a plurality of patterned conductors on a substrate; depositing a first dielectric layer on the patterned conductors; patterning the dielectric layer to form at least one first window which exposes portions of the top surface of the patterned conductors; and forming a layer of amorphous silicon on the exposed top portions. Circuit fabrication continues by depositing a second dielectric layer and patterning the second dielectric to form at least one second window which exposes portions of the amorphous silicon. Typically, pluralities of first and second windows are present. A metal is deposited in at least one window and may also be deposited on the surface of the dielectric and patterned.

In a preferred embodiment, the amorphous silicon is formed on the exposed surfaces by depositing and patterning. The first dielectric should be relatively thin, and the windows desirably have aspect ratios of 0.5:1 or smaller. The antifuse may then be programmed by application of a voltage across the antifuse stack in excess of the threshold voltage.

For reasons of clarity, the elements depicted are not drawn to scale.

DETAILED DESCRIPTION

Figure 1:
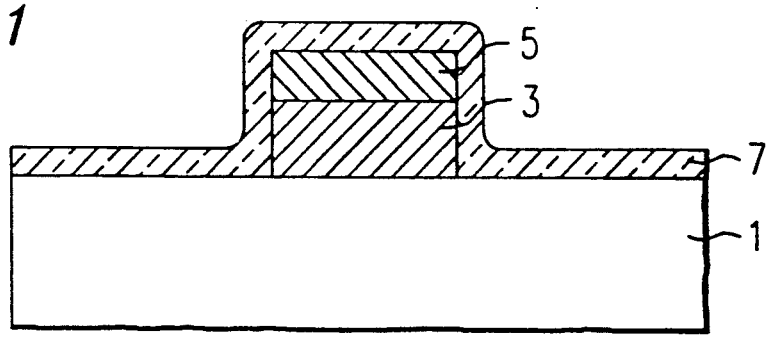
FIGS. 1-4 are sectional views of a portion of an integrated circuit including an antifuse stack at several stages of fabrication according to this invention.

An exemplary embodiment of this invention will be described and then several alternative embodiments will then be mentioned. FIG. 1 depicts substrate 1, conductor 3, first barrier layer 5, and first dielectric layer 7. The term substrate is used to mean material which lies underneath and supports another material. The substrate 1 may thus be silicon with or without device elements, or a dielectric such as a silicon oxide or nitride, etc. The conductor will typically be aluminum, frequently with minor amounts of other elements such as copper or silicon, which is deposited by well known techniques. The barrier layer comprises a material which prevents interdiffusion of aluminum and silicon. Such barrier layers and materials are well known to those skilled in the art. After the barrier layer has been deposited, it and the aluminum are patterned to form patterned conductors. A first dielectric layer 7 is now deposited. The dielectric is desirably a dielectric which can be deposited in a thin layer. An exemplary choice is plasma enhanced TEOS with or without dopants.

Figure 2:
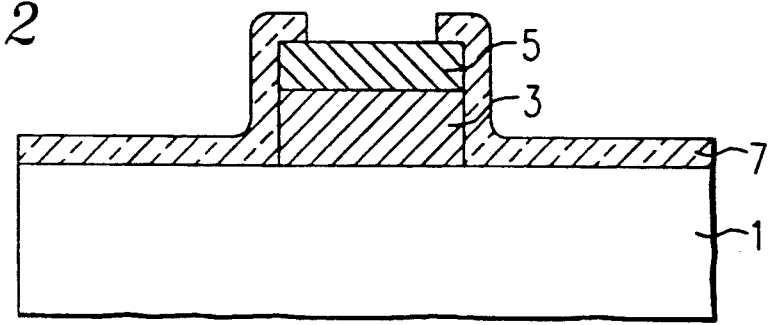

The first dielectric layer 7 is now patterned to form windows which expose at least selected portions of the top surface of the patterned conductor, i.e., portions of the surface of first barrier layer 5 are exposed. Because the dielectric layer is thin, the windows can have an aspect ratio of 0.5:1 or less. Such a small aspect ratio is desirable because it helps ensure uniformity in the subsequently deposited amorphous silicon. Conventional and well known techniques can be used for these steps, and the structure produced is depicted in FIG. 2.

Figure 3:
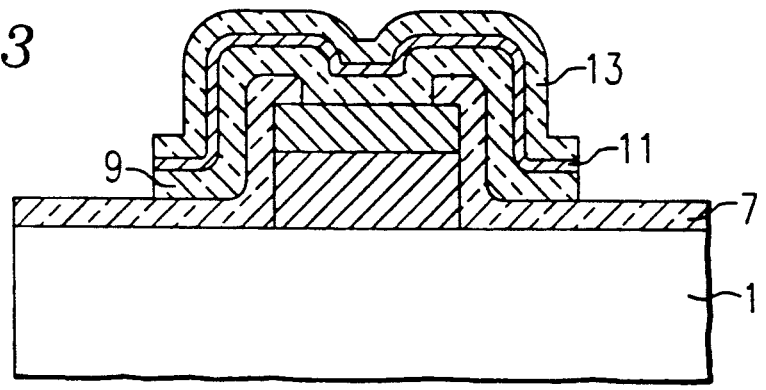

Amorphous silicon 9, conductive material 11, and a second barrier material 13 layers are now deposited and patterned to cover exposed portions of the top of the patterned conductor. The resulting patterned structure is depicted in FIG. 3. The amorphous silicon should have a high resistance in the OFF state. The inclusion of a relatively small amount, typically less than 20 atomic percent, of a dopant such as hydrogen in the amorphous silicon helps to increase the resistance. The conductive material 11, e.g., titanium or the material of conductor 3, is a material that reduces the resistance of the amorphous silicon when the programming voltage is applied. The programming voltage probably produces localized heating which is followed by diffusion of either or both the silicon or conductive material and formation of a silicide. Conductive materials other than titanium will be readily selected by those skilled in the art. The conductive materials may be on the other side of the amorphous silicon layer, i.e., between layers 5 and 9, and there may even be two layers of conductive material present, one on each side of the amorphous silicon layer. Additionally, the conductive material may be omitted in some embodiments. The material from the patterned conductor 3 then performs the functions of the conductive material. The second barrier layer serves the same function as does the first barrier layer 5.

Figure 4:
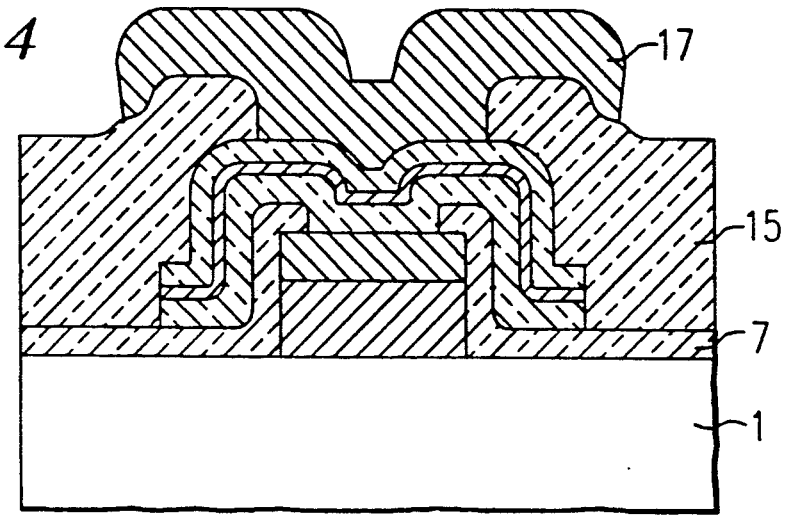

A dielectric layer 15 is deposited and patterned to form at least one window which exposes selected portions of the amorphous silicon. A metal 17 is now deposited in the window and may be deposited on the top of the dielectric layer as well. If it is deposited on the top, it is patterned to form a structure of the type depicted in FIG. 4.

Several comments about the structure are now appropriate. Less amorphous silicon is required than for the process in which an amorphous silicon is deposited in a window although the additional mask is a drawback. However, the antifuse of this invention has characteristics which do not vary significantly from antifuse to antifuse and the variation in programming voltage is less than for antifuses in which the silicon is deposited in a window.

Other embodiments will be readily thought of by those skilled in the art. For example, the patterned conductors might be elements of individual devices. Dielectrics other than TEOS may be used. Additionally, the conductor might be tungsten, and the first and second barrier layers can be omitted.

I claim:

1. A method of integrated circuit fabrication comprising forming an antifuse by the steps of forming a plurality of patterned conductors on a substrate;
   depositing a first barrier layer on said patterned conductors;
   depositing a first dielectric layer on said barrier layer;
   patterning said first dielectric layer to form at least a first window which exposes portions of the top surface of said barrier layer;
   depositing and patterning a layer of amorphous silicon to cover said exposed portions;
   depositing at least one layer of conductive material, said at least one layer being adjacent said amorphous silicon; and
   depositing a second barrier layer on said conductive material.

2. A method as recited in claim 1 comprising the further steps of depositing a second dielectric layer and patterning said second dielectric layer to form at least a second window which exposes portions of said amorphous silicon.

3. A method as recited in claim 2 comprising the further step of depositing a metal in said at least a second window.

4. A method as recited in claim 3 comprising the further step of applying a voltage across the amorphous silicon in excess of the threshold voltage thereby programming said amorphous silicon.

5. A method as recited in claim 1 in which said first windows have an aspect ratio of 0.5:1 or smaller.

* * * * *